United States Patent [19]

Chester et al.

[11] Patent Number: 5,795,797
[45] Date of Patent: Aug. 18, 1998

[54] METHOD OF MAKING MEMORY CHIPS USING MEMORY TESTER PROVIDING FAST REPAIR

[75] Inventors: Michael A. Chester, Thousand Oaks; Steven A. Michaelson, Moorpark, both of Calif.

[73] Assignee: Teradyne, Inc., Boston, Mass.

[21] Appl. No.: 516,709

[22] Filed: Aug. 18, 1995

[51] Int. Cl.$^6$ .............................. H01L 21/00; G11C 7/00; G11C 29/00
[52] U.S. Cl. .............................. 438/4; 365/200; 371/10.3
[58] Field of Search .............................. 437/8; 365/200; 371/10.3; 438/4

[56] References Cited

U.S. PATENT DOCUMENTS

| | | | |
|---|---|---|---|
| 4,414,665 | 11/1983 | Kimura et al. | 371/21 |
| 4,627,053 | 12/1986 | Yamaki et al. | 371/10.3 |
| 4,628,509 | 12/1986 | Kawaguchi | 371/21 |
| 4,639,915 | 1/1987 | Bosse | 371/10.3 |
| 4,736,373 | 4/1988 | Schmidt | 371/10 |
| 4,876,685 | 10/1989 | Rich | 371/21.6 |
| 5,363,382 | 11/1994 | Tsukakoshi | 371/21.2 |
| 5,514,628 | 5/1996 | Enomoto et al. | 438/4 |

OTHER PUBLICATIONS

Tar et al. *Defect Analysis System Speeds Test And Repair Of Redundant Memories*, Electronics International, vol. 57 (1984) Jan., No. 1 pp. 175–179.

Wey et al., *On The Repair Of Redundant RAM's* IEEE Transactions On Computer–Aided Design, vol. CAD–6, No., 2, Mar. 1997.

Huang et al. *Minimizing The Cost Of Repairing WSI Memories* Integration, the VLSI Journal (1991) Jun., No. 3.

Primary Examiner—Brian Dutton
Attorney, Agent, or Firm—Edmund J. Walsh

[57] ABSTRACT

A process for manufacturing semiconductor memories which includes a method of quickly and effectively identifying which faulty memory cells are to be replaced by redundant memory structures. Redundant rows and columns are assigned to replace rows and columns with faulty cells in an iterative process. At each pass, one row or column is identified for replacement. A row or column is selected for replacement based on priorities assigned to the faulty cells within the rows and columns. The highest priority cell for a row is the one in a column with the fewest other faulty cells. Where multiple cells have the same highest row priority, the cell in a row with the most faulty cells is given a higher priority. A similar dual measure is used for assigning column priorities to cells. Once a highest priority row and column are identified, the single element with the highest priority is identified. In cases where multiple structures have the same highest priority, alternative criteria are used to select a single element for replacement. Preprocessing is used to focus, at each iteration, on the best faulty elements to replace. One preprocessing technique is to constrain the choice for replacement to faulty cells within certain clusters, which, based on the distribution of failures will require either a row or column for repair. Another preprocessing technique is to constrain the choice for replacement to faulty cells within a segment which must use either a row or column for repair. When the choice for replacement in a group of faulty cells is constrained to faulty cells which require a redundant row or column for repair, only the priorities of the rows or columns, respectively, in that group of cells is considered.

24 Claims, 5 Drawing Sheets

5,795,797

METHOD OF MAKING MEMORY CHIPS USING MEMORY TESTER PROVIDING FAST REPAIR

This invention relates generally to the manufacture of semiconductor memories and more specifically to repairing defective memory cells.

Virtually all computers use semiconductor memory chips. As computer processors have gotten more powerful, the amount of memory needed in a computer has increased. As a result, the number of bits of information that can be stored in one memory chip has increased.

As more memory has been used, market demands have forced memory manufacturers to reduce the price of memory. Historically, the price per bit of storage has decreased significantly. Increasing size and decreasing price have combined to make a very difficult challenge for manufacturers of semiconductor memories. Namely, they must reduce their cost of making memories.

One difficulty in reducing the cost of making larger memories is that the chance of a defective semiconductor memory increases as the size of the memory increases. Thus, lower yields are to be expected as memory size increases. Yield is, however, a very significant factor affecting the production cost of a semiconductor circuit.

To boost yields, memory manufacturers include redundant cells as part of each semiconductor memory. Defective cells are replaced by the redundant cells to make a completely functioning memory. Provided the repair can be performed quickly, production costs can be reduced by repairing defective dies.

The repair is typically made as part of the wafer level test. Each die on a wafer is tested with a high speed memory tester, such as the J993 sold by Teradyne, Inc. of Aguora Hills, Calif., U.S.A. The tester identifies dies with faulty memory cells and makes a record of which cells are faulty. The tester then computes which memory cells should be replaced by redundant cells to repair the defective memories. This information is passed on to a repair station, typically as an electronic data file. The repair station makes the required connections on the die, typically using a laser to permanently alter the die.

The cells in the memory are arranged in rows and columns. The redundant cells are also arranged in rows and columns. Repairs are made by replacing either the entire row or the entire column containing a defective cell.

There are only a limited number of redundant rows and columns, which limits the number of defective cells that can be repaired. If there are more defective cells than can be repaired, the entire die is typically discarded.

Very often, defective cells occur in clusters. Thus, it is often possible to repair several defective cells by replacing a single row or a single column. By appropriate usage of the redundant rows and columns, even memories with many defects can be repaired using a few redundant rows and columns. To get the best usage of the redundant rows and columns, many memory testers are programmed to try different ways to use the redundant rows and columns until they find one that repairs all defective cells. This technique is called a "brute force" technique. If there is any solution that allows all defective cells to be replaced, this technique will eventually find it. The technique is, however, relatively slow. For large memories, this technique is likely to be too slow.

An alternative method for determining how to allocate the redundant rows and columns to repair specific defects is called the "Most." With this technique, the tester identifies the row or column with the highest number of defective memory cells. One redundant element is used to repair that row or column. The row or column with the next highest number of defective cells is then repaired. The process is repeated until all the redundant elements are used. This method often works and is much faster than a brute force technique. However, there are some patterns of defective cells which could be repaired that will not be repaired by allocating redundant elements in this fashion.

One technique for increasing the speed at which memory repairs can be made is called the "Must" technique. The Must takes advantage of the fact that any row which contains more faulty cells than there are redundant columns must be repaired, if at all, with a redundant row. Likewise, any column which contains more faulty cells than there are redundant rows must be repaired, if at all, with a redundant column. Therefore, the Must is typically used as a preprocessing step to accurately allocate redundant elements to those faulty cells which must be repaired with those redundant elements.

Even with the Must used for preprocessing, brute force processes can be very slow and the Most processes might not repair all repairable memories. It would be highly desirable if there were a method to repair memory cells which quickly found a way to repair all the defects in the memory cell if such a repair were possible.

SUMMARY OF THE INVENTION

With the foregoing background in mind, it is an object of the invention to quickly repair all defects in a memory chip using redundant rows and columns.

It is also an object to quickly repair memories in which regions have multiple segments.

The foregoing and other objects are achieved by processing failure information obtained from a memory test. The failure information is processed by assigning a row, column pair to each defective cell in the cluster. The row number represents the number of defective cells in the same row and the column number represents the number of defective cells in the same column as the defective cell. The cell with the smallest number in its row column pair is selected to be repaired. Where multiple cells have the same smallest number, the cell with the highest combined row and column numbers is selected. The cell is repaired by a redundant row if the row number is larger or by a redundant column if the column number is larger. The process is then repeated.

In one embodiment, the cells are grouped into clusters of more than one cell in which each cell is collinear with another cell in the cluster. One cluster of defective cells is processed at a time. Clusters that cannot be repaired using either redundant rows only or redundant columns only are processed first.

In another embodiment, when the memory is organized into segments which share redundant rows or columns, a segment which can not be repaired using only redundant rows or columns is first selected for processing.

In another embodiment, the first step in the process is to allocate redundant rows or columns to those rows or columns using the industry standard "Must" process.

BRIEF DESCRIPTION OF THE DRAWINGS

The invention will be better understood by reference to the following more detailed description and accompanying drawings in which.

3

Figure 2A:
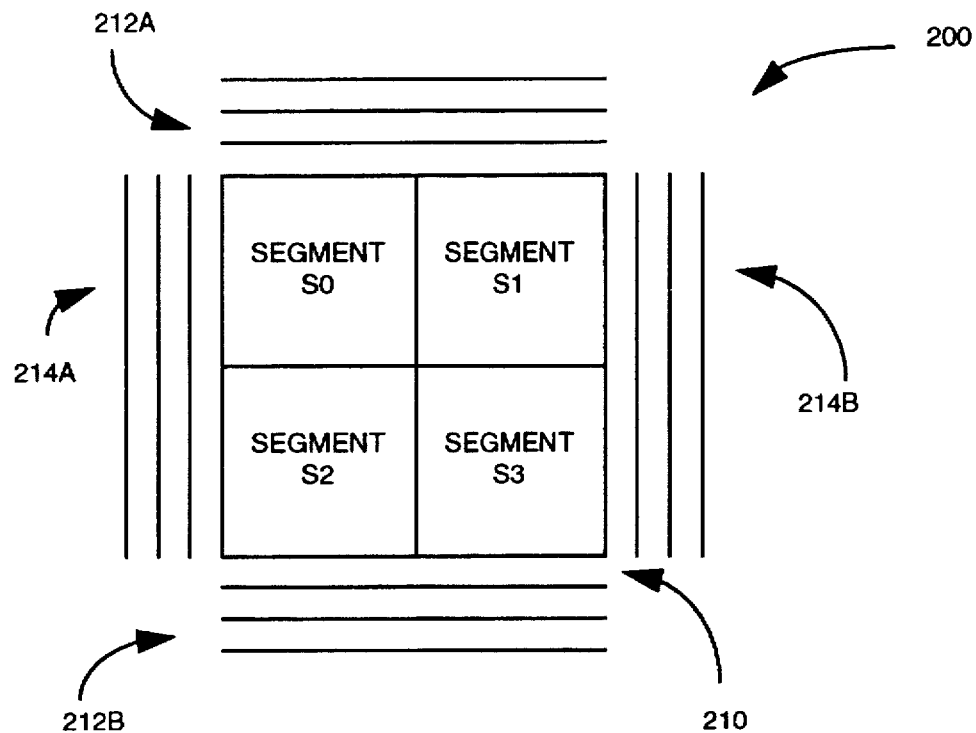
Figure 2B:
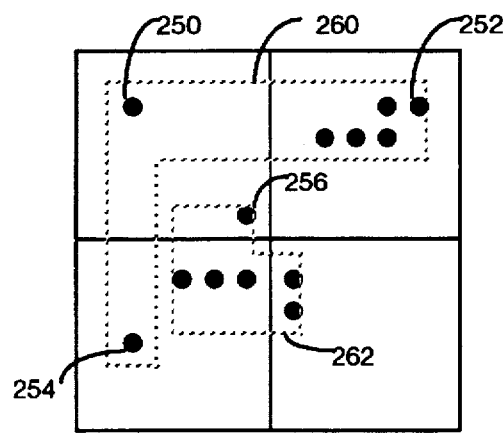
Figure 3:
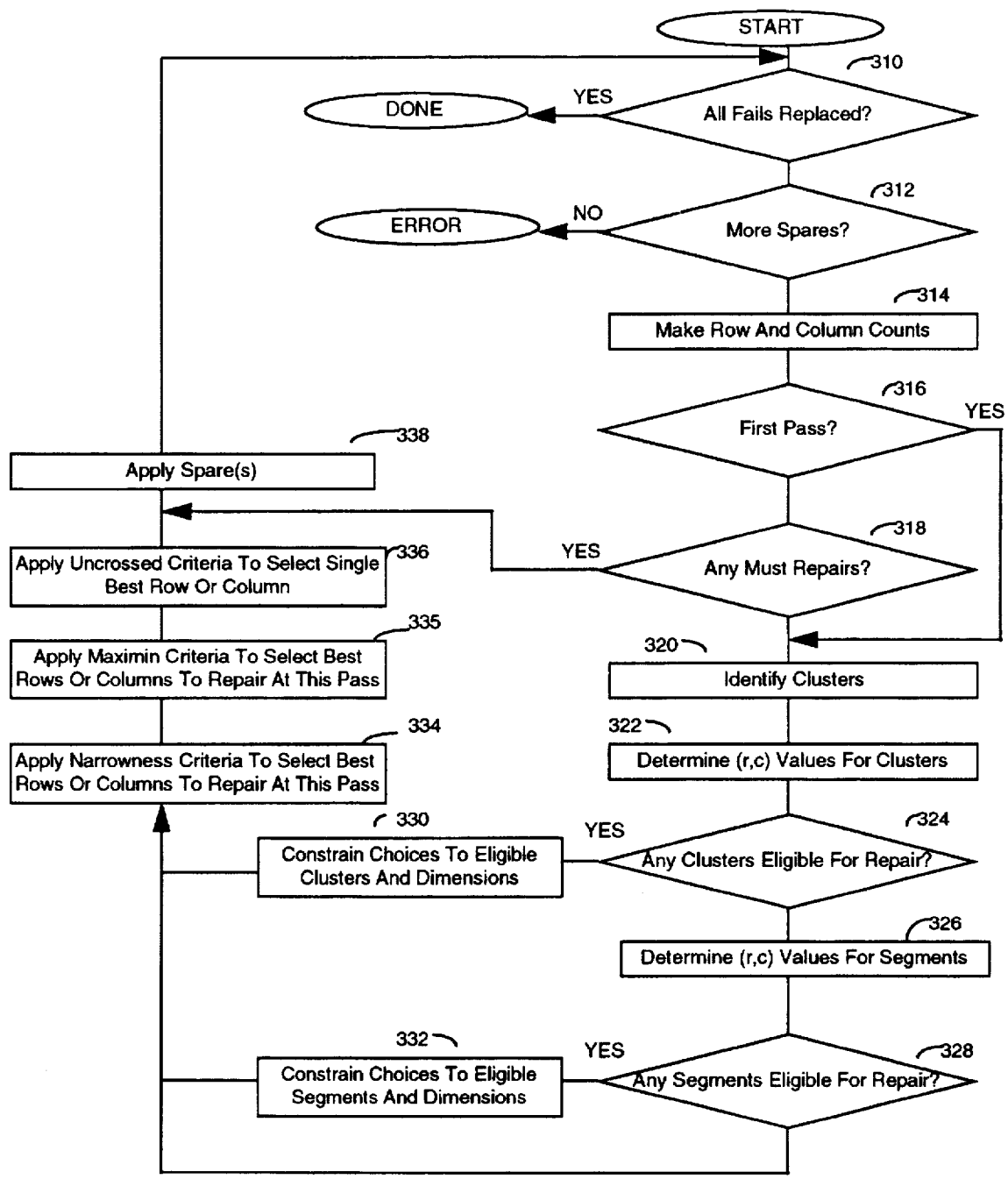

FIG. 2A is a diagram illustrating a region of a semiconductor memory;

FIG. 2B is a diagram illustrating clusters of faults in a memory region with multiple segments;

FIG. 3 is a flow chart illustrating the method of the invention;

FIG. 4A–4E are diagrams illustrating one example of the operation of the method of FIG. 3; and FIG. 5A–E are diagrams illustrating a second example of the operation of the method of FIG. 3.

DESCRIPTION OF THE PREFERRED EMBODIMENT

Figure 1:
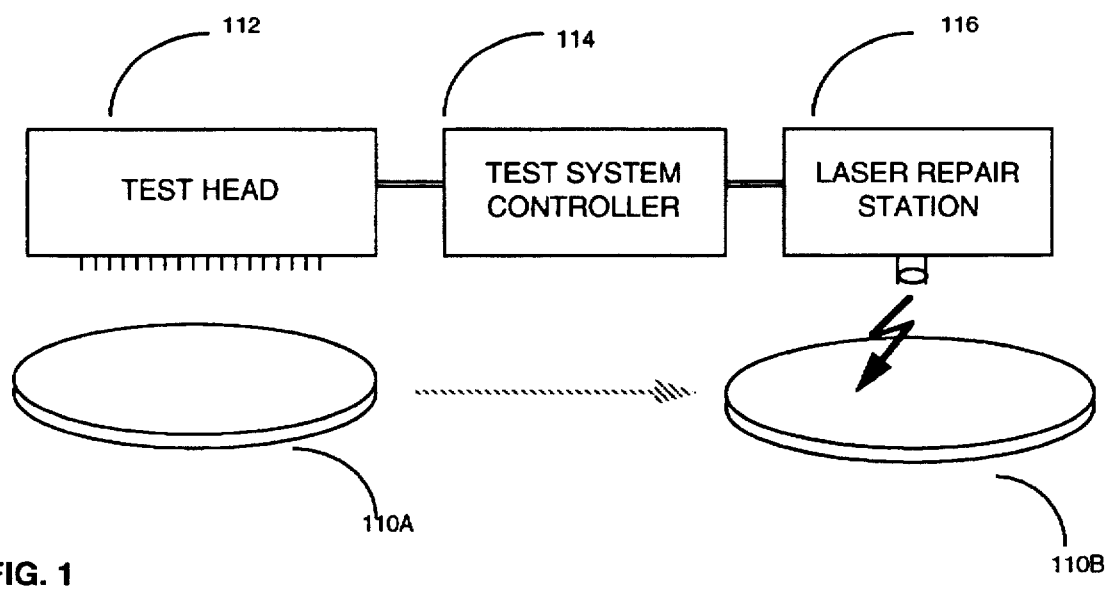
FIG. 1 is a block diagram of a memory test system incorporating the invention.

FIG. 1 shows a test system such as might be used in the manufacture of semiconductor memory chips. Memories are fabricated on a wafer 110A according to any known process. Wafer 110A is presented to a test head 112 where each memory on wafer 110A is tested in response to commands from test system controller 114.

Test head 112 and test system controller 114 are part of any commercially available memory test system. The J993 from Teradyne, Inc. is one example of such a test system, but any commercially available memory test system could be used.

Test head 112 interfaces to wafer 110A so that test signals may be written to and read back from each memory on wafer 110A. Test head 112 and test system controller 114 operate, as is known in the art, to detect cells of each memory on wafer 110A that do not operate properly.

As is known in the art, test system controller 114 processes the information about faulty cells in each memory. When the memories contain redundant rows and columns, test system controller 114 computes how the redundant rows and columns can be used to repair the defective cells. Test system controller 114 includes a computer and the computation is performed in accordance with instructions programmed into the computer.

Once test system controller 114 determines how the defective cells in a memory can be repaired using the redundant rows and columns in the memory, this information is passed to a laser repair station 116. Wafer 110A is moved to position 110B at the laser repair station 116. Laser repair station 116 uses the information provided by test system controller 114 to repair the memories on wafer 110B. The repairs are made by directing the laser to alter portions of the memory chip, causing the defective rows and columns to be disconnected from the memory and connecting redundant rows or columns in their place.

FIG. 2A illustrates schematically the organization of one region 200 of a memory. A region typically contains thousands of cells organized into rows and columns. Each memory might have one or multiple regions. Each region is the portion of a memory which can be repaired independently of any other region. Region 200 includes redundant rows 212A and 212B and redundant columns 214A and 214B, which are used to repair defective cells in region 200.

Region 200 is divided into segments, S0, S1, S2 and S3. Redundant rows 212A can replace rows in segments S0 and S1. Redundant rows 212B can be used to replace defective cells in segments S2 and S3. Redundant columns 214A can be used to replace defective cells in segments S0 and S2. Redundant columns 214B can be used to replace defective cells in segments S1 and S3.

The number and arrangements of regions, segments and redundant rows or columns is selected by the memory manufacturer. The numbers and arrangements shown herein are illustrative rather than limiting.

FIG. 2B illustrates the formation of clusters of faulty cells in region 200. As will be described below, the faulty cells will be processed by clusters. A cluster is a group of faulty cells, which must contain at least two faulty cells. Any two faulty cells that could be replaced by a single spare are in the same cluster. Grouping of cells in this fashion is associative. For example, faulty cells 250 and 252 would be replaced by use of one of the redundant rows 212A. Thus, faulty cells 250 and 252 are in the same cluster. Faulty cell 250 and faulty cell 254 could both be replaced by use of one redundant column 214A. Thus, faulty cells 250, 252 and 254 are all in cluster 260.

On the other hand, faulty cell 256 is not in the same row or column as any cell in cluster 260. It would not be replaced by the same redundant element as any cell in cluster 260. Therefore, faulty cell 256 falls into a different cluster, cluster 262.

The cells in a cluster are "mutually co-linear." "mutually co-linear" means that each cell in a cluster is co-linear with at least one other cell in the cluster. For purposes of defining clusters, "co-linear" means that two cells could be replaced by the same spare. Thus, it should be noted that grouping of cells into clusters is a function of the distribution of the faulty cells as well as the arrangement of spares.

A faulty cell which is not mutually co-linear with another faulty cell is not assigned to any cluster. A faulty cell which has not been assigned to a cluster is termed a "singlet." Singlets are processed differently than clusters. If a region contains only singlets, no spare can possibly repair more than one faulty cell. Therefore, certain steps which serve to allocate redundant elements to repair multiple failures in a cluster are not needed for singlets.

The cells in a cluster are also "exclusively co-linear." "Exclusively co-linear" means that all cells that are co-linear are always in the same cluster. No cell in one cluster is "co-linear" with a cell in a different cluster. Thus, clusters are defined as groups of mutually and exclusively co-linear fault cells.

Turning now to FIG. 3, a flow chart of the memory repair process of the invention is shown. As described above, test system controller 114 determines which cells of the memory under test are faulty. Also, as described above, an industry standard Must preprocess is used to allocate redundant elements to some of the faulty cells. This fault information remaining after the preprocessing is further processed as shown in FIG. 3.

The process shown in FIG. 3 is an iterative process. Each pass through the process results in one redundant row or column (hereafter more simply called a "spare") being assigned to replace one row or column of the region 200. In a preferred embodiment, the process of FIG. 3 is performed in a computer in test system controller 114.

The process of FIG. 3 is repeated iteratively until all rows or columns containing faulty cells are replaced or until all spares are used. The process starts at step 310, which determines whether all faulty cells have been replaced. If all fails have been replaced, the process is completed.

If fails remain, execution continues at step 312. Step 312 determines whether there are more spares remaining. If there are no spares remaining, execution also terminates. However, execution terminates in an exception or error condition because the memory region can not be repaired.

Execution proceeds to step 314. At step 314, the number of "co-linear" faulty cells in each row and column is counted. The numbers are stored for later use.

Processing then continues at step 316. At step 316, a check is made to determine whether the current pass is the first pass through the process. In computer software, such a check can be made in any number of ways, such as by setting a flag before execution of the process and then clearing it at the end of the process. During the first pass, the execution proceeds to step 320.

For each pass other than the first, execution proceeds to step 318. At step 318, a check is made whether any row or column must be replaced with either a redundant row or column. Step 318 uses the industry standard Must process described above. Step 318 is skipped in the first pass through the process because, as described above, the failure information is preprocessed with the Must process and this process does not need to be repeated until the failure information changes, i.e. by allocating a redundant element to repair some cells as described below.

The rows and columns identified for replacement are passed as parameters to step 338, where spares are assigned to those rows and columns as described below.

If no rows or columns are identified for replacement at step 318, execution proceeds to step 320. At step 320, clusters are identified. Various methods might be used to group cells into clusters. One process might be to construct multiple linked list data structures in computer memory. Each faulty cell is processed in turn. Each cell is checked to determine whether it is co-linear with a cell in each list already started. If the cell is not co-linear with any cell in any list, it is used to start a new list. If the cell is co-linear with a cell on a list, it is added to that list. However, if the cell is co-linear with cells on multiple lists, those lists are combined into one list and the cell is added to the combined list. Once all faulty cells are processed, each list with two or more cells represents one cluster.

It is known in the art that linked lists are a convenient data structure for quickly sorting or grouping items. However, linked lists require a large amount of memory because each entry in a list contains, in addition to the data values for that entry, pointers to the next entry in the list. If computer memory space is limited in test system controller 114, it might be preferable to construct non-linked lists in memory. A non-linked list is created by storing grouped values in consecutive locations in memory. Such a list uses less space, but to combine lists, it is necessary that data values be reorganized in memory to have all entries in the combined lists stored in consecutive memory locations.

It should be noted that cells in rows or columns which have, because of processing at prior steps, already been designated as being replaced by a redundant element are no longer treated as faulty cells and are not included in the clusters. Thus, as rows and columns are identified for replacement with redundant elements, the clusters may change.

Processing continues at step 322. At this step, an (r,c) value is assigned to each cluster. The (r,c) value represents a pair of Boolean values. When the r value is true, which herein is designated R, it indicates that the cluster can be repaired with the number of available redundant rows without using any redundant columns. Conversely, when the r value is false, which herein is designated R*, the cluster can not be repaired with the available redundant rows. Likewise, the c value will be true or false, indicating whether the cluster can be repaired with the available redundant columns, without using redundant rows.

An available redundant row or column is one that has not already been designated for use in repairing the memory under test. As the process of FIG. 3 is performed, redundant elements are designated one by one. Thus, the (r,c) value assigned to each cluster can change at each pass through the process of FIG. 3.

Figure 4A:
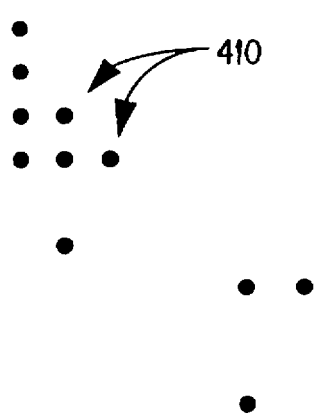
Figure 4B:
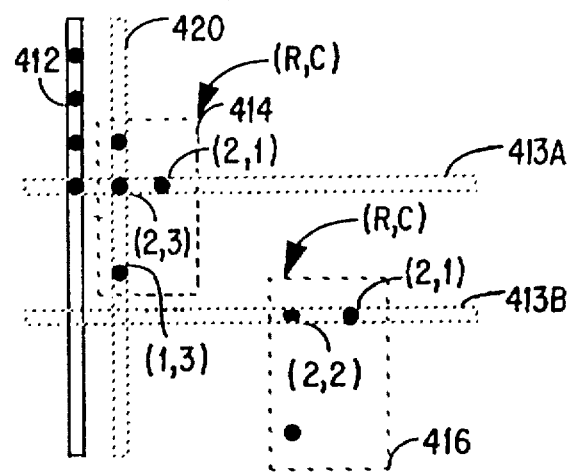
Figure 4C:
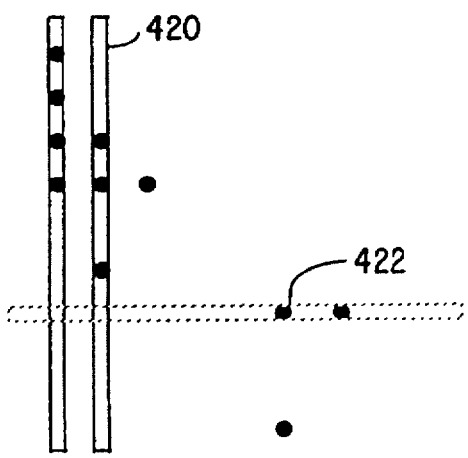

For example, FIG. 4B shows two clusters 414 and 416. In the example of FIGS. 4A through 4E, the segment has three redundant rows and three redundant columns. One column has been used, leaving three redundant rows and two redundant columns. As clusters 414 and 416 could each be repaired by using no more than the three available redundant rows or two available columns, they are each assigned a value of (R,C).

The (r,c) values are stored as part of the data structure for the clusters. In addition to assigning an (r,c) value to each cluster, an (r,c) value is assigned to each segment. The (r,c) value for a segment indicates whether the faulty cells in the segment can be repaired using only available redundant rows or columns, respectively. The segment of FIG. 4B has a total of five rows with faulty cells and four columns. As there are only three available redundant rows and two available redundant columns, this segment is assigned an (r,c) value of (R*,C*).

For memories in which redundant elements span multiple segments, the cells associated with each set of redundant elements is considered separately. For example, FIG. 2B shows that redundant columns 214B are the only columns available to repair cells in segments S1 and S3. Since cluster 260 contains cells in four columns in segment S1 (more than the available three column spares), at least one row spare must be used to repair cluster 260 and cluster 260 gets a C* value.

Cluster 262 has four fails in a row, but, because of the placement of those faulty cells, does not require a row be used to repair the cluster. Specifically, cluster 262 has three faulty cells in a row in segment S2 and another faulty cell in the same row in cluster S3. The three faulty cells in segment S2 can be repaired with redundant columns 214A. The faulty cell in segment S3 can be repaired with a redundant column 214B. Thus, those four cells in a row can be repaired with available column spares.

Once (r,c) values are assigned for each cluster, execution proceeds to step 324. At step 324 a determination is made whether any clusters are "eligible" for repair. A cluster is "eligible" for repair when it has an R* or a C* value. Where any cluster has such a value, execution proceeds to step 330. In a preferred embodiment, a flag is set at step 320 when any cluster has a value of (R*,C), (R,C*) or (R*,C*) and step 324 branches to step 330 when that flag is set.

At step 330, those clusters which are eligible for repair are selected for further processing. In this further processing one redundant element will be allocated to replace a row or a column in one of the eligible clusters. Clusters with an R* value will require at some point a redundant column be used for repair. Therefore, step 330 specifies that the further processing should only apply a column to a cluster with an R* value. Likewise, step 330 specifies that the clusters with a C* value will only be repaired with a redundant row. Clusters with both an R* and a C* value could be repaired with either a redundant row or a redundant column. In that case, step 330 designates that further processing could select either a redundant row or a redundant column to repair failures in that cluster.

Step 330 constructs a data structure in the computer memory of test system controller 114. The clusters eligible for further processing are identified in the data structure. Where clusters are identified by linked lists, the data structure representing eligible clusters could be merely a list of pointers to the selected lists. However, many other ways to represent selected values are commonly used in computers. In addition to the list of eligible clusters, an indication of whether a redundant row or redundant column should be allocated to the cluster is also included in the data structure.

The data structure representing the eligible clusters is then passed to step 334 for further processing. Step 334 selects from the eligible clusters those clusters meeting a first level criteria, termed a "narrowness" criteria. "Narrowness" refers to the minimum number of rows or columns which contain faulty cells within a cluster. For example, if a first cluster has faulty cells in three rows and two columns, it has a column narrowness of two and a row narrowness of three. A cluster with faulty cells in a single column and five rows is more narrow in the row direction than in the column direction. It has a column narrowness of one but a row narrowness of five.

Step 334 selects only the clusters which are the most narrow in the row direction and those which are most narrow in the column direction. It first selects only those clusters with faulty cells in a single row or a single column; i.e. those with a narrowness of one. If there are no such clusters, it selects only those clusters with faulty cells in two rows or two columns; i.e. with a narrowness of two. Step 334 continues in this fashion until it identifies the minimum narrowness of all the eligible clusters. The data structure representing the clusters eligible for replacement is reduced to just those clusters having the minimum narrowness in the row direction and those clusters having the minimum narrowness in the column direction. The row and column narrowness values are also stored in that data structure for later use.

Execution then proceeds to step 335 where the selection of eligible clusters is further processed. At step 335, each faulty cell within an eligible cluster is assigned a rank in the form of (n,m), where n is the number of faulty cells in the cluster in the same row as that faulty cell and m is the number of faulty cells in the cluster in the same column as that cell. For example, FIG. 4B shows two clusters, 414 and 416. The faulty cells in cluster 414 have ranks of (1,3) (2,3) (2,1) (1,3). The faulty cells in cluster 416 have ranks of (2,2) (2,1) and (1,2).

At step 335, the best rows and the best columns are selected for replacement based on the ranks. The best row is the row containing the faulty cell with the smallest m (column value). Where there are multiple faulty cells with the same smallest m value, the best of these is the one with the largest n value. The best column is the column containing the faulty cell with the smallest n (row value). Where there are multiple faulty cells with the smallest n value, the best of these is the one with the largest m value.

As described above, each cluster eligible for repair has associated with it an indication of whether a row could be replaced or a column could be replaced or either could be replaced with a redundant element. For clusters which are eligible for repair with a row, only the best row is selected. For clusters eligible for repair with a column, only the best column is selected. For clusters eligible for repair with either a row or a column, the best row or column is selected. In this last scenario, the m (column) value of the best row cell is compared to the n (row) value of the best column cell, as a first argument. The n value of the best row cell is compared to the m value of the best column cell as a co-argument. As before, the selection is made based on the smallest argument and the largest coargument.

Once the best element or elements are identified for each cluster eligible for replacement, the over all best element or elements are selected. As above, the element with the smallest argument is selected. If multiple rows or columns all have the smallest argument, then the one with the largest coargument is selected as the best.

It is possible that multiple rows or columns will have the same rank such that there are multiple best rows or columns. In that case, all of them are retained with a single best being selected during later processing. As before, the designation of selected rows and columns is made by constructing a data structure within the computer memory in test system controller 114. Any convenient data structure might be used, such as a linked list or an unlinked list.

Processing then proceeds to step 336 where a single best row or column is selected for replacement. If a single best row or column has already been selected, then this step is not necessary. Of the rows and columns selected at step 335, those which are "uncrossed" are preferred for replacement. "Crossed" rows or columns share at least one faulty cell with another selected element. Thus, step 336 determines for each row or column selected at step 336 the number of faulty cells that are common to that row or column and the other rows or columns selected at step 335. The row or column with the fewest such shared faulty cells is selected as the single best.

In cases where there are multiple rows or columns meeting the criteria for the single best, one of those elements can be selected arbitrarily. Alternatively, a preference for replacing a row or column might be included in the processing at step 336. For example, step 336 might choose, as the single best element for replacement, a row when there are more redundant rows available or a column where there are more redundant columns available. In situations where there are only rows or only columns available, then step 336 must select an element for replacement for which there is a redundant element available. Alternatively, test system controller 114 might accept as an input a preference for a row or column to be replaced when there are multiple best rows or columns. A user might then specify this preference based on the architecture of memory 200.

Regardless of the criteria used for selecting between rows and columns, if no single best element is selected, one of the best can be selected randomly. The selected single best row or column is then passed on for actual repair.

Processing continues at step 338 where spares are applied. In the system shown in FIG. 1, the processing shown in FIG. 3 is performed in test system controller 114, which is separate from repair station 116. Thus, spares are applied at step 338 by creating a data structure which indicates which of the spares is allocated to a specific row or column. That data structure is later passed to laser repair station 116 where the indicated spares are used to repair the indicated rows. However, if the processing of FIG. 3 were performed within laser repair station 116, then a spare could be applied by actually physically altering the memory 200 at that time.

When a spare is applied, step 338 also updates data structures used in other steps of FIG. 3. In particular, the data structure recording the number of available spares must be changed to reflect that a spare has been used. In addition, the data structure recording the faulty cells must also be changed to remove all faulty cells in the row or column replaced with the spare.

Once a spare is applied at step 338, processing then returns to step 310. The process is repeated to select another row or column for replacement. The process repeats in this fashion, applying one spare in each pass, until all fails are replaced or there are no more spares.

The processing described above was for the case when step 324 determined that there were clusters eligible for repair. Similar processing is performed when step 324 determines that no clusters are eligible for repair. In that case, though, processing proceeds from step 324 to step 326.

Step 326 determines (r,c) values for each segment. These values have the same significance as for clusters. An r value of R* implies that a segment can not be repaired with only available redundant rows. A c value of C* indicates that a segment can not be repaired with only available redundant columns. For example, the segment shown in FIG. 4A has faulty cells in seven rows and five columns. If that segment had three redundant rows and three redundant columns, it would have an (r,c) value of (R*,C*).

Once (r,c) values are determined for each segment in the region, processing proceeds to step 328. Step 328 determines whether any of the segments has an R* or a C* value. Any such segment is eligible for repair. In a preferred embodiment, a flag is set at step 322 when any segment has a value of (R*,C), (R,C*) or (R*,C*) and step 328 branches to step 332 when that flag is set.

When at least one segment is eligible for repair, processing proceeds to step 332. Step 332 is similar to step 330 in that it builds a data structure of faulty cells eligible for repair. However, the data structure includes all faulty cells within the eligible segments.

When the allocation of spares has repaired all failures within clusters, all remaining failures will be "singlets." In the case that no clusters remain, step 332 places the singlets rather than clusters in the data structure of eligible choices. The processing for singlets is a simplified version of the processing for clusters. All singlets will have the same narrowness criteria and same maximin criteria. Also, no singlets can be crossed. Therefore, steps 334, 335 and 336 do not choose among singlets in a segment.

However, if the (r,c) value of a segment indicates a row should be used or a column should be used, then that type of redundant element is chosen for application to a singlet in that segment. Likewise, if there is a user preference or other mechanism for determining whether a redundant row or column could be used, then that type of redundant element is used. Once the type of redundant element to be applied to a segment is selected, which one of the singlets that redundant element is applied to can be selected arbitrarily.

As above, the data structure made at step 332 also includes an indication of whether the clusters could be repaired with a redundant row or a redundant column. In a segment with an R* value, the repair is constrained to be done with a redundant column. In a segment with a C* value, the repair is constrained to be done with a row. For segments with a value of (R*,C*), the repair could be done with either a row or a column.

Once the faulty cells in the eligible segments are identified, processing proceeds to step 334. As described above, the processing at steps 334, 335 and 336 selects, from all the faulty cells eligible for repair, the single best row or column to repair and a redundant element is applied at step 338.

When no clusters and no segments are eligible for repair as determined at steps 324 and 328, processing proceeds from step 328 to step 334. This process path bypasses steps 330 and 332, which constrain the choices eligible for repair. Thus, when processing proceeds from step 328 directly to step 334, any cluster is eligible for repair and repair could be made with either a redundant row or a redundant column. When all clusters are repaired, then, as discussed above, the singlets are repaired arbitrarily.

The processing on these clusters is otherwise identical to the processing described above. The single best row or column for replacement is selected at steps 334, 335 and 336. A spare is applied at step 338 to make that best replacement.

FIGS. 4A through 4E shows an example of the application of the processing described in conjunction with FIG. 3. For memory 200 as shown in FIG. 2, there are a maximum of three redundant rows and columns available per segment. FIG. 4A shows an example of a pattern of redundant cells 410 in one segment. FIG. 4B shows that the column 412 must be replaced with a redundant column. This redundant column is allocated, as in the prior art, as part of Must preprocessing before the steps of FIG. 3 are performed.

FIG. 4B shows two clusters 414 and 416. These are identified at step 320. Cluster 414 spans three rows and two columns. Cluster 416 spans two rows and two columns. In the example of FIGS. 4A through 4E, the segment has three redundant rows and columns. One column has been used, leaving three redundant rows and two redundant columns. As each of the clusters 414 and 416 could be repaired by using no more than three redundant rows or two columns, they are both assigned a value of (R,C). Therefore, processing passes through step 324 to 326.

The segment of FIG. 4B has a total of five rows with faulty cells and four columns. As there are only three available redundant rows and two available redundant columns, this segment is assigned an (r,c) value of (R*,C*).

Processing then proceeds to step 332. At step 332, the clusters 414 and 416 are selected for further processing. Since the (r,c) value of the segment is (R*,C*), either a row or column might be replaced in one of these clusters.

At step 334, the narrowness criteria are applied. Cluster 416 is the narrowest in the row dimension, spanning only two rows. Clusters 414 and 416 each have a column dimension of 2 and so are both retained for further processing.

For Maximin processing at step 335 in the row direction, the minimum number of unrepaired faulty cells in any column is one. Two of the cells in FIG. 4B share this number. Each of these is one of two in its row. Thus, each has a rank, as indicated of (2,1). Thus, both rows 413A and 413B are identified as possible row replacements at step 335.

Of the cells in cluster 414, two cells have a row count of one, which is the lowest row count. These occur in the same column, with a column count of three. Thus, they each have a rank of (1,3). As both of the cells of rank (1,3) fall in column 420, column 420 is the single best column for replacement.

Thus, column 420 and rows 413A and 413B are possible replacement targets. However, a column with a rank of (1,3) has a larger co-argument than a row of rank (2,1). Thus, column 420 is selected as the single best candidate for replacement and step 336 is not necessary. A column spare is therefore allocated at step 338.

In the next pass through the processing of FIG. 3, there is one remaining redundant column. Thus, at step 318, any row with more than one faulty element will be identified as an element which must be replaced with a row. Therefore, row 422 containing two faulty cells is replaced.

Figure 4D:
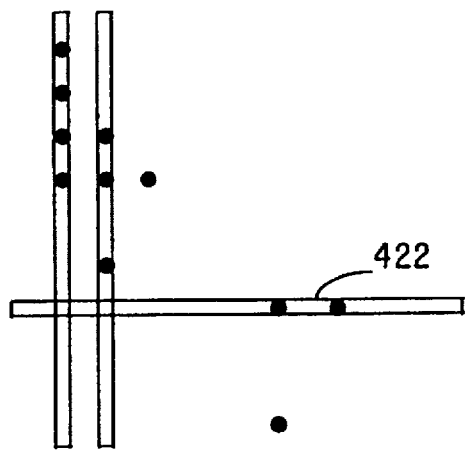

As shown in FIG. 4D, after this allocation is made, there are only two singlet failures left. In the next pass through the processing of FIG. 3, there will be one remaining redundant column and two remaining redundant rows. As there are no rows or columns which contain more faults than there are redundant elements, none must be repaired. There are also no clusters identified. Therefore, processing proceeds to step 326.

The segment shown in FIG. 4D has a value of (R.C*). Therefore, execution proceeds through step 332, where a replacement row is specified. In this case, it does not matter which of the singlets receives the row. Row 426 is allocated.

In the next pass, only one singlet remains and there is one redundant row and one redundant column. Therefore, the segment value is (R,C) such that either redundant element might be used. In the example of FIGS. 4A through 4E, there is a preference for column replacement. Thus, column 424 is applied to repair the remaining failure.

Figure 4E:
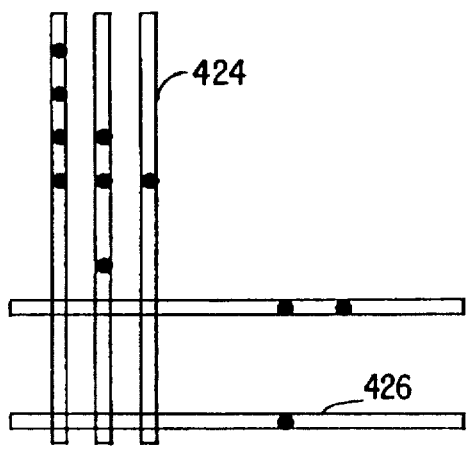

In the simple example of FIGS. 4E through 4E, there is no need to determine the segment (r,c) values since only one segment is illustrated. However, where there are multiple segments which share spares, using the segment (r,c) values to select segments ensures that a redundant element is not used in one segment if that redundant element is needed to make repairs in another segment.

Another example is given in FIG. 5. FIG. 5A shows a pattern of faulty cells in a memory segment. In FIG. 5B, it is shown that a redundant column 512 is used to repair a column with more than three defective cells in it, according to Must preprocessing.

Figure 5A:
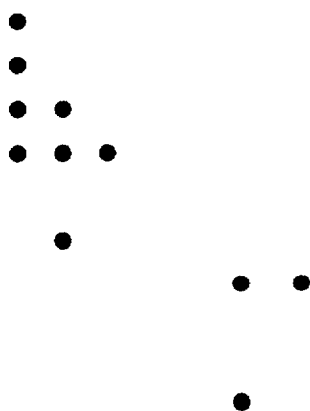
Figure 5B:
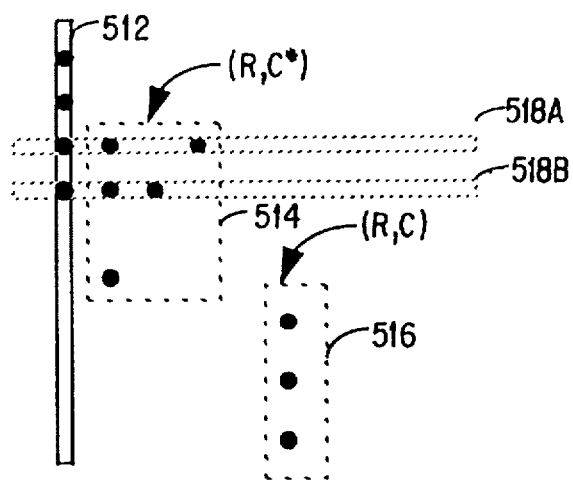

FIG. 5B also shows two clusters 514 and 516. Cluster 514 has a value of (R.C*). Cluster 516 has a value of (R,C). Thus, at step 324, it is determined that cluster 514 is eligible for repair. The C* value indicates that a row must be allocated for repair. Thus, step 330 constrains the choice of repairs to a row in cluster 514.

Since there is only one cluster identified, step 334 does not further narrow the choices.

The faulty cells in cluster 514 have ranks, in left to right, top to bottom order, of (2,3), (2,1), (2,3), (2,1) and (1,3). Of these, the minimum column argument is 1. The maximum coargument is 2. Two of the cells share the rank of (2,1). Thus, at step 335, rows 518A and 518B are each identified as a possible row for replacement.

The uncrossed criterion at step 336 does not narrow the choice, since there is no column choice and neither row crosses a column choice. Therefore, one of the rows is selected randomly. Row 518 is allocated.

Figure 5C:
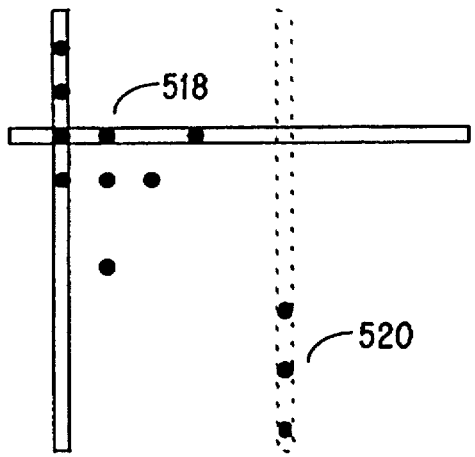

FIG. 5C shows that after this repair, three faulty cells are in column 520. As there are only then two remaining redundant rows, these three faulty cells must be repaired with a column. Thus, in the next pass, execution passes through step 318 to step 328, where column 520 is applied.

Figure 5D:
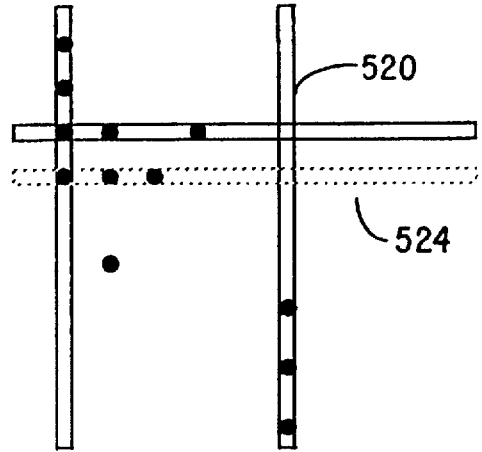

In the next pass, as shown in FIG. 5D, there is one remaining redundant column and two remaining redundant rows. Row 524 contains two faulty cells. It therefore must be repaired by a row. Again, execution passes through step 318 to step 338 where a redundant row 524 is applied.

Figure 5E:
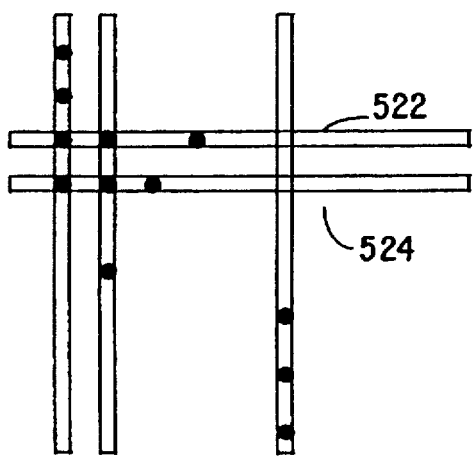

FIG. 5E shows that the remaining single faulty cell which is not part of a cluster is repaired using a redundant column. As in the example of FIGS. 4A through 4E, either a redundant row or column could be used for the repair, but the example shows a preference for a column replacement.

According to the process of the invention, redundant elements are quickly allocated for use in repairing defective memory cells. The allocation is also efficient. In this way, the manufacturing time for memories is significantly reduced.

It is believed that the process of the invention works well because it quickly identifies those cells which will eventually require a redundant row or a column to repair and then allocates that redundant element for the repair. If it is possible to repair the memory with the limited number of redundant elements, processing the faulty cells in this order will result in that repair being made.

On the other hand, if there are more defective cells which will eventually require a redundant row than there are redundant rows, the method of the invention will quickly yield this result. The same is true if there are more cells that will eventually require a redundant row than there are redundant rows. Thus, the invention also reduces processing time attempting to repair a memory which can not be repaired.

These advantages are obtained

Having described one embodiment, numerous alternative embodiments or variations might be made. For example, step 318 might be omitted.

Also, it is possible that the order of various processing steps might be reversed. For example steps 320, 322 and 324 dealing with cluster processing might be performed after steps 326 and 328 dealing with segments.

Also, the processing might be embellished with steps to identify when a solution will not be reached. For example, if there are more clusters than there are redundant elements, no repair is possible. Alternatively, if there are more C* clusters than there are redundant rows, no repair will be found. If there are more R* clusters than there are redundant columns, no repair will be found either. These conditions might be checked to reduce processing time.

Another embellishment might be to modify step 312 in FIG. 3 to detect when the entire process need not be repeated. Even though there are redundant memory structures remaining, if there are only one type, it might not be necessary to repeat the entire process. There is in that case no need to check whether a row or column should be used to make repair as there is one type to choose from.

Also, it should be noted that the memory test system pictured in FIG. 1 is illustrative of commercially available memory manufacturing equipment. variations are possible. For example, the processing described in conjunction with FIG. 3 could be performed in laser repair station 116 instead of in test system controller 114. In such an embodiment, test system controller 114 would pass data depicting failure locations to laser repair station 116 rather than a data file instructing laser repair station 116 to make the required substitutions of redundant rows and columns. In this embodiment, the repairs could be made as the redundant rows and columns were allocated rather than all being made at the end of the processing.

In another arrangement, the process of FIG. 3 could be performed in a separate computer. Such an embodiment might be preferred if the test system controller 114 and the laser repair station 116 do not have adequate memory or processing ability to perform the required steps of the method.

Also, it should be appreciated that the specific data structures mentioned for processing according to the invention are illustrative. Many data structures are possible for implementing the invention.

Further, the disclosed embodiment of the invention employs two processes which might be used separately. In one process, rows and columns are selected for replacement by identifying rows or columns (which might generally be referred to as "memory structures") of minimum width and maximum length (i.e. with the minimum argument and maximum coargument). This process is called a "maximin process."

A second part of the process is the use of (r,c) values for clusters and segments. These values modify the selection of which segment or cluster should be processed first. The (r,c)

logic could be used with other conventional memory repair processes. Alternatively, the minimal process could be used without (r,c) logic.

Therefore, the invention should be limited only by the spirit and scope of the appended claims.

What is claimed is:

1. A method of repairing a semiconductor memory having a plurality of memory structures including rows and columns of memory cells and redundant rows and columns, the method comprising:

a) testing the memory to identify faulty cells and creating in a computer a representation of the faulty cells;

b) assigning to selected ones of the faulty cells in the representation a first argument and a second argument, for each selected faulty cell the first argument representing the number of faulty cells in the same row and the second argument representing the number of faulty cells in the same column as said selected faulty cell, the arguments having values that can be ordered from high to low;

c) assigning priorities to said faulty cells in the representation based i) primarily on one of either the first or second arguments, with lower valued arguments being assigned a higher priority; and ii) secondarily on the other of the first or second arguments, with larger valued arguments being assigned a higher priority;

d) using the assigned priorities to select a faulty cell from the faulty cells to which priorities were assigned at step c);

e) allocating a redundant memory structure to repair the faulty cell selected at step d), the redundant memory structure being a row when the argument used in the step of primarily prioritizing represents said number of faulty cells in the same column as the faulty cell selected at step d) and the redundant memory structure being a column when the argument used in the step of primarily prioritizing represents the number of faulty cells in the same row as the faulty cell selected at step d).

2. The method of claim 1 additionally comprising the steps of a) altering the representation of the faulty cells to remove faulty cells replaced by the allocated redundant memory structure;

b) repeating steps b) through e) of claim 1.

3. The method of claim 2 wherein steps a) and b) of claim 2 are repeated until no faulty cells remain in the representation or all redundant rows and columns are allocated.

4. The method of claim 2 wherein the step of allocating comprises constructing in a computer memory a data structure indicating which memory structure of the semiconductor memory being repaired are to be replaced by redundant memory structures.

5. The method of making a semiconductor memory using the method of claim 4, and additionally comprising the steps of:

a) providing the data structure to a repair station; and b) physically altering the semiconductor memory in accordance with the replacement information in the data structure.

6. The method of claim 1 wherein the steps of claim 1 are repeated for each region of the semiconductor memory.

7. The method of claim 1 wherein the step of assigning arguments to selected faulty cells comprises:

a) identifying clusters of mutually, exclusively collinear faulty cells; and b) selecting at least one cluster and assigning values to faulty cells within the selected cluster.

8. The method of claim 7:

a) additionally comprising the step of assigning to each cluster logic values indicating whether the cluster can be repaired using only unallocated redundant rows or repaired using only unallocated redundant columns; and b) wherein the step of selecting a cluster comprises, when any of the clusters has a logic value indicating it can not be repaired with either only unallocated redundant rows or only unallocated redundant columns, selecting at least one such cluster.

9. The method of claim 1 wherein the semiconductor memory is organized into at least one region with each region having a plurality of segments, each segment containing memory structures, and each segment having associated with it redundant memory structures, with the redundant memory structures associated with each segment being associated with at least one other segment in the region:

a) additionally comprising the step of assigning to each segment logic values indicating whether the segment can be repaired using only unallocated redundant rows or repaired using only unallocated redundant columns;

b) wherein the step of selecting a faulty cell comprises the step of, when at least one of the segments has a logic value indicating it can not be repaired with either only unallocated redundant rows or only unallocated redundant columns, selecting a faulty cell in one of such segments.

10. In a process for manufacturing a semiconductor memory organized into rows and columns of memory cells, a method of replacing faulty memory cells with redundant rows and columns, the method comprising the steps of:

a) selecting a row or column to replace with a redundant element according to the steps of:

i) identifying clusters of faulty segments, each cluster containing mutually, exclusively co-linear cells, ii) selecting as candidates for a column replacement those clusters which can not be repaired using only unallocated redundant rows;

iii) selecting as candidates for a row replacement those clusters which can not be repaired using only unallocated redundant columns;

iv) prioritizing the rows in each cluster selected as a candidate for row replacement and prioritizing the columns in each cluster selected as a candidate for column replacement; and v) selecting a row or column with the highest priority;

b) allocating a redundant row or column to replace the selected row or column and repeating steps a) and b) until all rows and columns containing faulty cells have been selected for replacement at step a).

11. The method of manufacturing a semiconductor memory of claim 10 wherein a) the memory is organized into segments, each segment having a unique combination of redundant rows and redundant columns which can be used to replace rows and columns in that segment; and b) the step of selecting a redundant row or column additionally comprises, when there are no clusters selected as candidates for row replacement or candidates for column replacement, I) selecting as candidates for row replacement those segments having faulty cells which can not be repaired with only unallocated redundant columns;

ii) selecting as candidates for column replacement those segments having faulty cells which can not be repaired using unallocated redundant rows;

iii) prioritizing the rows in each segment selected as a candidate for row replacement and prioritizing the columns in each segment selected as a candidate for column replacement; and iv) selecting a row or column with the highest priority.

12. The method of manufacturing a semiconductor memory of claim 10 wherein the step of prioritizing rows and columns comprises:

a) assigning a first value and a second value to each faulty cell within the row or column, which are i) in the case of a row, the first being the number of faulty cells in the same column as the faulty cell and the second being the number of faulty cells in the same row as the faulty cell; and ii) in the case of a column, the first being the number of faulty cells in the same row as the faulty cell and the second being the number of faulty cells in the same column as the faulty cell;

b) assigning a priority to the cells in each row and column, with the highest priority going to the cells with the lowest first value, and, when multiple cells have the same first value, the highest priority going to those with the highest second value, c) using the priority of the highest priority cell in each row as the priority of that row and the highest priority cell in each column as the priority of that column.

13. The method of manufacturing a semiconductor memory of claim 12 wherein the step of selecting a row or column for replacement comprises separately selecting the highest priority row and the highest priority column and then selecting the row or column with the higher priority.

14. The method of manufacturing a semiconductor memory of claim 13 wherein the step of selecting the row or column with the higher priority comprises:

a) comparing the first value of the highest priority faulty cell in each row and column to select the row or column containing a cell with the lowest first value; and b) when multiple rows or columns have highest priority cells having the same first value, selecting the row or column with the highest priority faulty cell having the highest second value.

15. The method of claim 14 wherein the step of selecting the row or column with the higher priority additionally comprises:

a) when multiple rows or columns have highest priority faulty cells having the same lowest first value and highest second value; selecting the row or column which shares the fewest faulty cells with other rows or columns having highest priority faulty cells with the lowest first value and highest second value.

16. The method of claim 10 additionally comprising the steps, prior to the step of selecting a row or column to replace, of a) determining which rows must be replaced because they contain more faulty cells than there are unallocated redundant columns and allocating a redundant row to those rows; and b) determining which columns must be replaced because they contain more faulty cells than there are unallocated redundant rows and allocating a redundant column to those columns.

17. A method of repairing a semiconductor memory having a plurality of rows and columns of cells, organized into segments, each segment having a unique combination of redundant rows and redundant columns, with certain of the cells in the memory being faulty, the method comprising the steps of:

a) selecting a row by:

i) for a first selected group of faulty cells, assigning a first value to each faulty cell representing the number of faulty cells in the same column and co-linear with the faulty cell and a second value representing the number of faulty cells in the same row and co-linear with the faulty cell;

ii) selecting the faulty cell with the lowest first value, iii) when multiple faulty cells have the same first value, selecting the faulty cell that also has the highest second value;

iv) selecting the row containing the selected faulty cell b) selecting a column by:

i) for a second selected group of faulty cells, assigning a first value to each faulty cell representing the number of faulty cells in the same row and co-linear with the faulty cell and a second value representing the number of faulty cells in the same column and co-linear with the faulty cell;

ii) selecting the faulty cell with the lowest first value, iii) when multiple faulty cells have the same first value, selecting the faulty cell that also has the highest second value;

iv) selecting the column containing the selected faulty cell;

c) selecting from the selected row and the selected column the element having a faulty cell with the lowest first value and, when multiple elements contains faulty cell with the lowest first value, the highest second value.

18. The method of claim 17 wherein the first selected group of faulty cells and the second selected group of faulty cells are not identical.

19. The method of claim 18 wherein the first selected group of faulty cells comprises those faulty cells in one segment of the memory.

20. In a process of manufacturing a semiconductor memory having numerous cells organized into rows and columns with redundant elements organized as rows and columns, in which the redundant rows and columns are used to replace faulty cells within the memory, the method comprising the steps of:

a) segmenting at least a portion of the faulty cells into groups;

b) selecting as row groups those which contain more faulty cells in a row than there are unassigned redundant columns and selecting as column groups those which contain more faulty cells in a column than there are redundant row;

c) prioritizing the rows of faulty cells within the row groups and prioritizing the columns of faulty cells within the column groups to select the row or column with the highest priority; and d) assigning a redundant element to the highest priority row or column; and e) repeating steps a) through e) to assign another redundant element to faulty cells which are not included in a row a column to which a redundant element has been assigned.

21. The method of claim 20 wherein the groups of cells comprise clusters of faulty cells which are mutually and exclusively co-linear.

22. The method of claim 20 wherein the groups of cells comprise cells within a segment of the memory.

23. The method of claim 20 wherein the groups of cells comprise cells in clusters of faulty cells which are mutually and exclusively co-linear.

24. The method of claim 23 wherein the groups of cells are constrained to those cells in clusters which a) have more faulty cells in a row then there are unassigned redundant columns or more faulty cells in a column than there are unassigned redundant rows, when there is at least one such cluster;

b) are in segments which have more faulty cells in a row then there are unassigned redundant columns or more faulty cells in a column than there are unassigned redundant rows, when there is at least one such segment.

* * * * *